United States Patent
Blaettler et al.

(10) Patent No.: US 9,813,079 B2
(45) Date of Patent: Nov. 7, 2017

(54) HIGH-THROUGHPUT COMPRESSION OF DATA

(71) Applicant: International Business Machines Corporation, Armonk, NY (US)

(72) Inventors: Tobias Blaettler, Maur (CH); Thomas Parnell, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 15/056,081

(22) Filed: Feb. 29, 2016

(65) Prior Publication Data

US 2017/0250708 A1   Aug. 31, 2017

(51) Int. Cl.
G06F 12/00 (2006.01)
H03M 7/42 (2006.01)
G06F 3/06 (2006.01)
H03M 7/30 (2006.01)

(52) U.S. Cl.
CPC ............ *H03M 7/42* (2013.01); *G06F 3/0608* (2013.01); *G06F 3/0661* (2013.01); *G06F 3/0673* (2013.01); *H03M 7/3086* (2013.01); *H03M 7/3088* (2013.01)

(58) Field of Classification Search
None
See application file for complete search history.

(56) References Cited

U.S. PATENT DOCUMENTS

| | | | |
|---|---|---|---|
| 5,001,478 A | 3/1991 | Nagy | |
| 5,532,693 A | 7/1996 | Winters et al. | |
| 8,356,060 B2 | 1/2013 | Marwah et al. | |
| 2015/0242433 A1 | 8/2015 | Itani et al. | |
| 2015/0242458 A1 | 8/2015 | Gatewood et al. | |

(Continued)

FOREIGN PATENT DOCUMENTS

JP   2008278258 A   11/2008

OTHER PUBLICATIONS

Fusco, Francesco et al., "RasterZip: Compressing Network Monitoring Data with Support for Partial Decompression", ACM, Proceedings of the 2012 ACM conference on Internet measurement conference (IMC'12), Boston, MA, Nov. 14-16, 2012, pp. 51-64.

(Continued)

*Primary Examiner* — Baboucarr Faal
(74) *Attorney, Agent, or Firm* — Francis Lammes; Stephen J. Walder, Jr.; Randall J. Bluestone

(57) ABSTRACT

A mechanism is provided for high-throughput compression of data. Responsive to receiving an indication of a match of a current 4-byte sequence from an incoming data stream to stored hash values in a set of hash tables, numerous variables are set to initial values. Responsive to receiving a subsequent 4-byte sequence from the incoming data stream and determining that an active match variable is set to one, the subsequent 4-byte sequence is compared to data in a copy of the incoming data stream in memory at an active position with a predefined length offset. A constraint variable is set to a number of bytes for which the match is to be extended. Responsive to the constraint variable being below a predetermined number, a length, distance pair is output indicating a match to a previous pattern in the incoming data stream.

20 Claims, 11 Drawing Sheets

(56) References Cited

U.S. PATENT DOCUMENTS

2015/0280736 A1* 10/2015 Ogasawara ......... H03M 7/3059
 341/51
2015/0280738 A1* 10/2015 Fuchs ................. H03M 7/3088
 341/51

OTHER PUBLICATIONS

Papadopoulos, Konstantinos et al., "Titan-R: A Multigigabit Reconfigurable Combined Compression/Decompression Unit", ACM Transactions on Reconfigurable Technology and Systems (TRETS), vol. 3, No. 2, Article 7, May 2010, 25 pages.

* cited by examiner

HIGH-THROUGHPUT COMPRESSION OF DATA

BACKGROUND

The present application relates generally to an improved data processing apparatus and method and more specifically to mechanisms for high-throughput compression of data.

Data storage systems commonly employ data compression to increase the effective storage capacity of the physical storage media within the data storage system. One common data compression technique employed in GZIP compression is dynamic Huffman compression. A data compressor that employs a dynamic Huffman compression architecture encodes input data blocks (also referred to herein as "data pages") utilizing a Lempel-Ziv77 (LZ77) encoder, extracts an optimal Huffman code for each LZ77-encoded data page, and then encodes each LZ77-encoded data page utilizing the optimal Huffman code for that data page to obtain compressed output data. The outputs of a dynamic Huffman compressor include the compressed output data and a code description of the optimal Huffman code utilized to encode each data page.

The LZ77 encoder achieves compression by replacing repeated occurrences of data with references to a single copy of that data existing earlier in the uncompressed data stream. A match is encoded by a pair of numbers called a length-distance pair, which is equivalent to the statement "each of the next length characters is equal to the characters exactly a distance of characters behind the character in the uncompressed stream". The "distance" is sometimes called the "offset" instead.

To spot matches, the LZ77 encoder keeps track of some amount of the most recent data, such as the last 2 kB, 4 kB, or 32 kB. The structure in which this data is held is called a sliding window, which is why LZ77 is sometimes called sliding window compression. The LZ77 encoder needs to keep this data to look for matches, and the decoder needs to keep this data to interpret the matches the encoder refers to. The larger the sliding window is, the longer back the LZ77 encoder may search for creating references.

SUMMARY

This Summary is provided to introduce a selection of concepts in a simplified form that are further described herein in the Detailed Description. This Summary is not intended to identify key factors or essential features of the claimed subject matter, nor is it intended to be used to limit the scope of the claimed subject matter.

In one illustrative embodiment, a method, in a data processing system, is provided for high-throughput compression of data. Responsive to receiving an indication of a match of a current 4-byte sequence from an incoming data stream to stored hash values in a set of hash tables, the illustrative embodiment sets an active match variable (active_match) equal to one (1); sets an active position variable (active_pos) equal to a match position (match_pos) of an increment variable (j) (match_pos[j]); sets an active length variable (active_len) equal to 4 minus the increment variable (j); and sets an active distance variable (active_dist) equal to a position variable (pos) plus the increment variable (j) minus the active position variable (active_pos). The illustrative embodiment compares the subsequent 4-byte sequence to data in a copy of the incoming data stream in memory at the active position (active_pos) with a predefined length offset in response to receiving a subsequent 4-byte sequence from the incoming data stream and determining that the active match variable (active_match) is set to one (1). The illustrative embodiment sets a constraint variable (k) to a number of bytes for which the match is to be extended. The illustrative embodiment outputs a length (L), distance (D) pair indicating a match to a previous pattern in the incoming data stream in response to the constraint variable (k) being below a predetermined number. In the illustrative embodiment, the length (L) of the matching pattern that is set to the active length (active_len) plus the constraint variable (k) and the distance (D) is set to the active distance (active_dist).

The illustrative embodiment may further increment the position variable (pos) by 4 before proceeding to the next 4-byte sequence. The illustrative embodiment may further set, the active length variable (active_len) to the active_len+4 in response to the constraint variable (k) being equal to the predetermined number; increment the position variable (pos) by 4 before proceeding to the next 4-byte sequence; compare the next 4-byte sequence to data in the copy of the incoming data stream in memory at the active position (active_pos) with a predefined length offset; and set the constraint variable (k) to a number of bytes for which the match is to be extended. Responsive to a failure to receive the indication of the match of the current 4-byte sequence from the incoming data stream to the stored hash values in the set of hash tables, the illustrative embodiment may output the incoming data at the increment variable (j) (data_in[j]) as a literal.

The illustrative embodiment may perform matching of the current 4-byte sequence from the incoming data stream to the stored hash values in the set of hash tables by computing a key value (Key[j]) for each of the current 4-byte data patterns at byte offsets j=0, 1, 2, and 3 using a hash function; in order to determine whether the current 4-byte data patterns at byte offsets j=0, 1, 2, and 3 have been observed earlier in the incoming data stream, in parallel: searching a first hash table in the set of hash tables for a first current 4-byte pattern at a byte offset j=0; searching a second hash table in the set of hash tables for a second current 4-byte pattern at a byte offset j=1; searching a third hash table in the set of hash tables for a third current 4-byte pattern at a byte offset j=2; and searching a fourth hash table in the set of hash tables for a fourth current 4-byte pattern at a byte offset j=3; and, responsive to detecting the match for byte offset j, setting a corresponding match flag match[j] to be equal to 1 and setting a corresponding entry in match position vector (match_pos[j]) equal to a hash table position (ht_pos) where the match was identified.

The illustrative embodiment may select the match with the largest hash table position (ht_pos) in response to identifying more than one match for the byte offset j. The illustrative embodiment may update the set of hash tables by computing a hash (Key[j]) for the current 4-byte data pattern at each byte offset j=0, 1, 2, and 3; and in parallel: storing the hash value at a byte offset j=0 in a first hash table; storing the hash value at a byte offset j=1 in a second hash table; storing the hash value at a byte offset, j=2 in a third hash table; and storing the hash value at a byte offset j=3 in a fourth hash table.

In other illustrative embodiments, a computer program product comprising a computer useable or readable medium having a computer readable program is provided. The computer readable program, when executed on a computing device, causes the computing device to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1A:
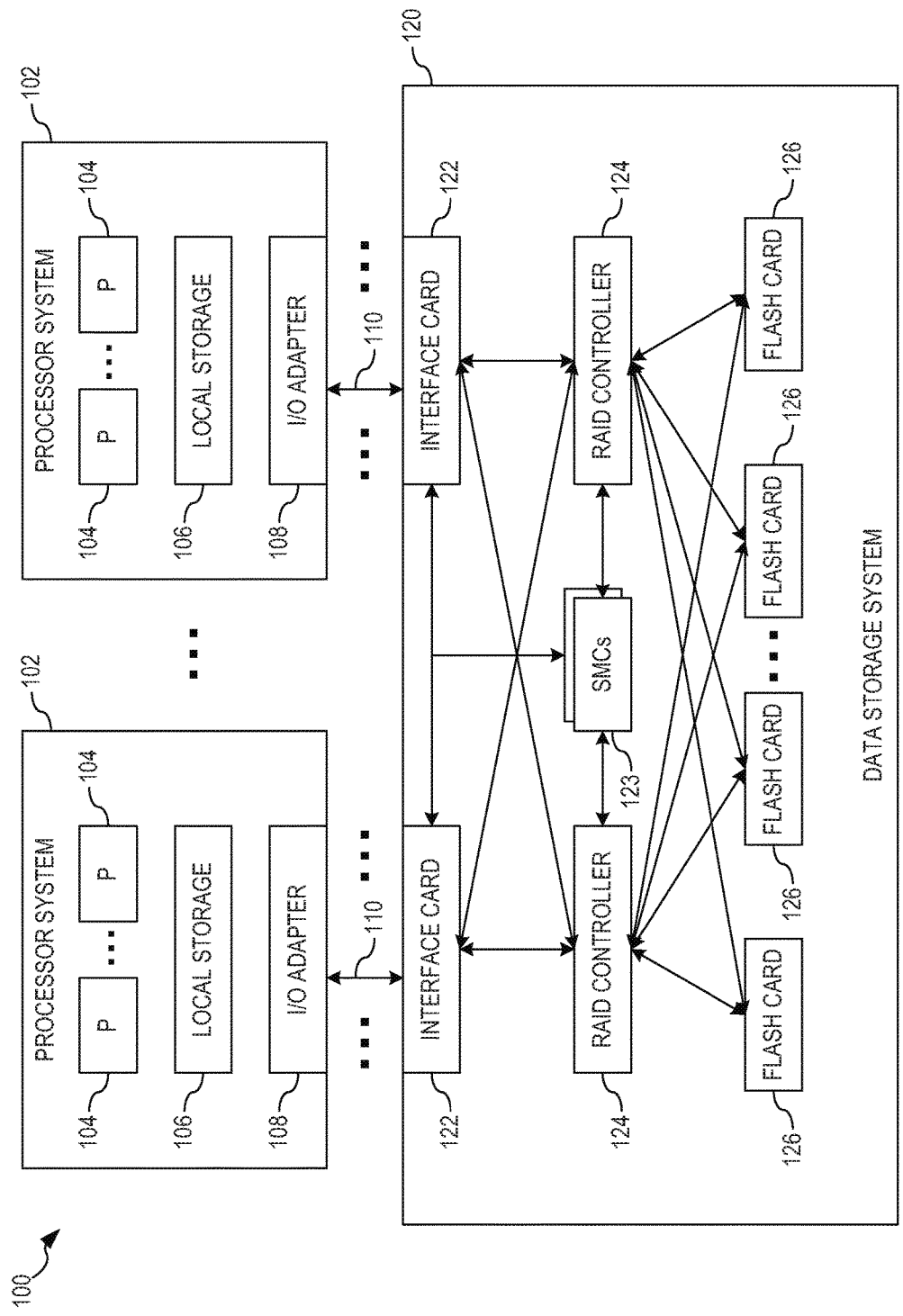
FIG. 1A depicts a high level block diagram of a data processing environment in accordance with an illustrative embodiment.

Again, a Lempel-Ziv77 (LZ77) encoder achieves compression by replacing repeated occurrences of data with references to a single copy of that data existing earlier in the uncompressed data stream. A match is encoded by a pair of numbers called a length-distance pair, which is equivalent to the statement "each of the next length characters is equal to the characters exactly a distance of characters behind the character in the uncompressed stream". The "distance" is sometimes called the "offset" instead.

In the illustrative embodiments, a modified LZ77 compression mechanism splits the LZ77 encoder logic into three distinct units: matcher logic, hash updating logic, and extender logic. The matcher logic compares incoming bytes with the dictionary of the previously-seen data that has been accumulated in hash tables. For every incoming byte, the matching logic determines whether a 4-byte match occurred somewhere earlier in the data stream. The hash updating logic accumulates previously-seen data in a dictionary by hashing the incoming data pattern at different offsets and storing each pattern, as well as the current position in the stream, in a hash table. To keep the size of the hash tables small, the hashing logic stores a relatively short data sequence, e.g. 4 bytes in each hash table entry. Utilizing the short 4-byte matches from the matching logic, the extender logic goes back in the data stream to identify which matches may be extended to longer matches (up to 258 bytes). If more than one match occurred, the extender logic chooses the longest, closest match for reasons related to the Huffman encoding that typically occurs after LZ77 encoding. However, current implementations of the extender logic consume the largest amount of area on a field-programmable gate array (FPGA).

Thus, the present invention provides an improvement to the extender logic so as to implement a high-throughput compression of data mechanism and reduce the size of the extender logic on a FPGA. In this implementation, the extender logic keeps a copy of all previously seen data in an associated memory. Having this copy of the data in the associated memory allows the extender logic to be implemented using a simple 2-state finite state machine (FSM). The minimum length of a match in the Lempel-Ziv-Welch (LZW) encoding is 4 bytes, which also happens to be the number of bytes that the LZW compression mechanism processes per clock cycle. Because of this alignment, the extender logic of the illustrative embodiments may be further simplified since the extender logic is never required to output more than a single (length, distance) pointer in a single clock cycle. This implementation results in a large area saving within the FGPA, e.g. 84% less look-up tables (LUTs), 70% less flip-flops, or the like, compared to previous adaptations for the LZW compression mechanism.

Before beginning the discussion of the various aspects of the illustrative embodiments, it should first be appreciated that throughout this description the term "mechanism" will be used to refer to elements of the present invention that perform various operations, functions, and the like. A "mechanism," as the term is used herein, may be an implementation of the functions or aspects of the illustrative embodiments in the form of an apparatus, a procedure, or a computer program product. In the case of a procedure, the procedure is implemented by one or more devices, apparatus, computers, data processing systems, or the like. In the case of a computer program product, the logic represented by computer code or instructions embodied in or on the computer program product is executed by one or more hardware devices in order to implement the functionality or perform the operations associated with the specific "mechanism." Thus, the mechanisms described herein may be implemented as specialized hardware, software executing on general purpose hardware, software instructions stored on a medium such that the instructions are readily executable by specialized or general purpose hardware, a procedure or method for executing the functions, or a combination of any of the above.

The present description and claims may make use of the terms "a", "at least one of," and "one or more of" with regard to particular features and elements of the illustrative embodiments. It should be appreciated that these terms and phrases are intended to state that there is at least one of the particular feature or element present in the particular illustrative embodiment, but that more than one can also be present. That is, these tennis/phrases are not intended to limit the description or claims to a single feature/element being present or require that a plurality of such features/elements be present. To the contrary, these terms/phrases only require at least a single feature/element with the possibility of a plurality of such features/elements being within the scope of the description and claims.

Moreover, it should be appreciated that the use of the term "engine," if used herein with regard to describing embodiments and features of the invention, is not intended to be limiting of any particular implementation for accomplishing and/or performing the actions, steps, processes, etc., attributable to and/or performed by the engine. An engine may be, but is not limited to, software, hardware and/or firmware or any combination thereof that performs the specified functions including, but not limited to, any use of a general and/or specialized processor in combination with appropriate software loaded or stored in a machine readable memory and executed by the processor. Further, any name associated with a particular engine is, unless otherwise specified, for purposes of convenience of reference and not intended to be limiting to a specific implementation. Additionally, any functionality attributed to an engine may be equally performed by multiple engines, incorporated into and/or combined with the functionality of another engine of the same or different type, or distributed across one or more engines of various configurations.

In addition, it should be appreciated that the following description uses a plurality of various examples for various elements of the illustrative embodiments to further illustrate example implementations of the illustrative embodiments and to aid in the understanding of the mechanisms of the illustrative embodiments. These examples intended to be non-limiting and are not exhaustive of the various possibilities for implementing the mechanisms of the illustrative embodiments. It will be apparent to those of ordinary skill in the art in view of the present description that there are many other alternative implementations for these various elements that may be utilized in addition to, or in replacement of, the examples provided herein without departing from the spirit and scope of the present invention.

Thus, the illustrative embodiments may be utilized in many different types of data processing environments. In order to provide a context for the description of the specific elements and functionality of the illustrative embodiments, FIGS. 1 and 2 are provided hereafter as example environments in which aspects of the illustrative embodiments may be implemented. It should be appreciated that FIGS. 1 and 2 are only examples and are not intended to assert or imply any limitation with regard to the environments in which aspects or embodiments of the present invention may be implemented. Many modifications to the depicted environments may be made without departing from the spirit and scope of the present invention.

Figure 2:
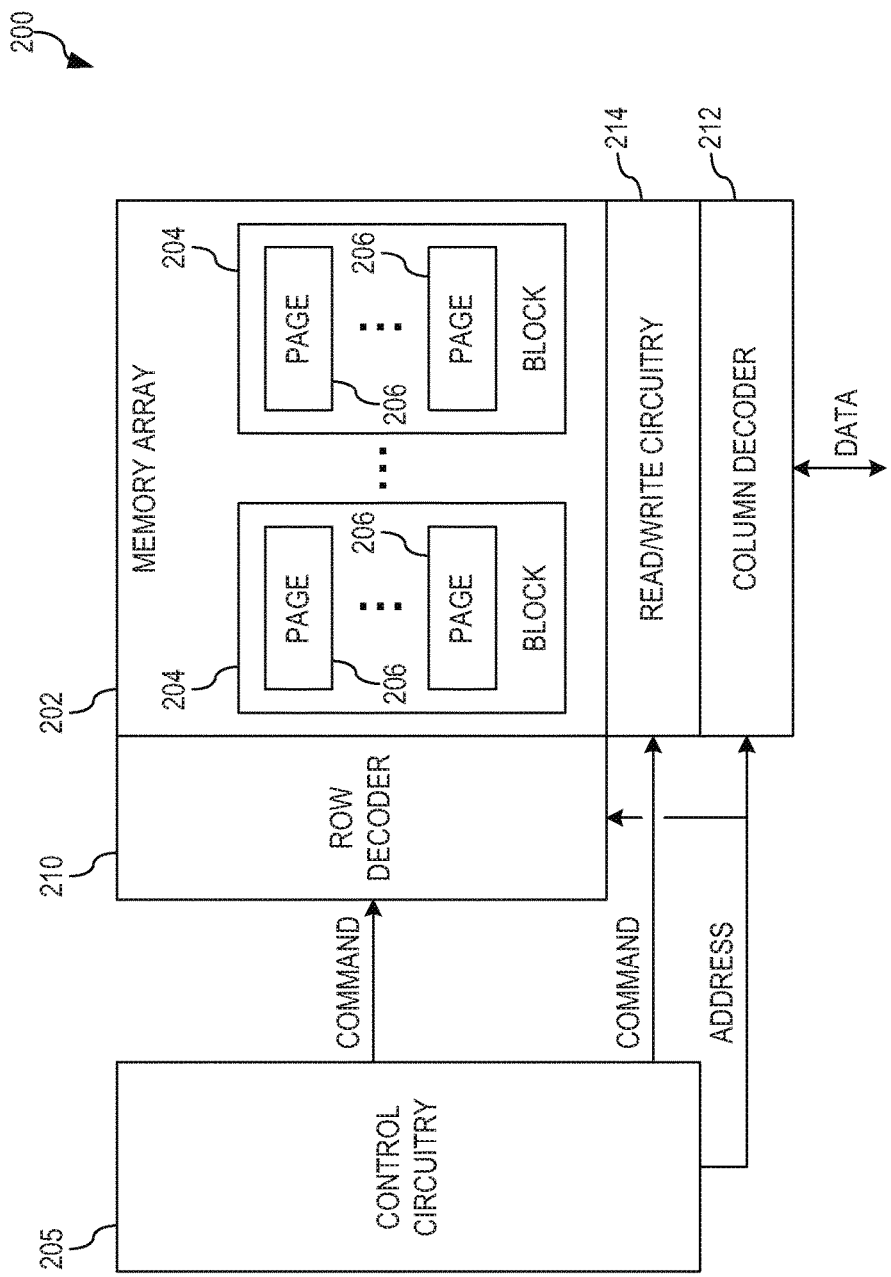
FIG. 2 depicts an exemplary NAND flash memory module in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as processor system 102 having one or more processors 104 that process instructions and data. Processor system 102 may additionally include local storage 106 (e.g., dynamic random access memory (DRAM) or disks) that may store program code, operands and/or execution results of the processing performed by processor(s) 104. In various embodiments, processor system 102 can be, for example, a mobile computing device (such as a smartphone or tablet), a laptop or desktop personal computer system, a server computer system (such as one of the POWER series of servers available from International Business Machines Corporation), or a mainframe computer system. Processor system 102 can also be an embedded processor system using various processors such as ARM, PowerPC, Intel X86, or any other processor combined with memory caches, memory controllers, local storage, I/O bus hubs, etc.

Each processor system 102 further includes input/output (I/O) adapter 108 that is coupled directly (i.e., without any intervening device) or indirectly (i.e., through at least one intermediate device) to data storage system 120 via I/O channel 110. In various embodiments, I/O channel 110 may employ any one or a combination of known or future developed communication protocols, including, for example, Fibre Channel (FC), FC over Ethernet (FCoE), Internet Small Computer System Interface (iSCSI), Infini-Band, Transport Control Protocol/Internet Protocol (TCP/IP), Peripheral Component Interconnect Express (PCIe), etc. I/O operations (IOPs) communicated via I/O channel 110 include read IOPs by which processor system 102 requests data from data storage system 120 and write IOPs by which processor system 102 requests storage of data in data storage system 120.

Although not required, in the illustrated embodiment, data storage system 120 includes multiple interface cards 122 through which data storage system 120 receives and responds to input/output operations (IOP) of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
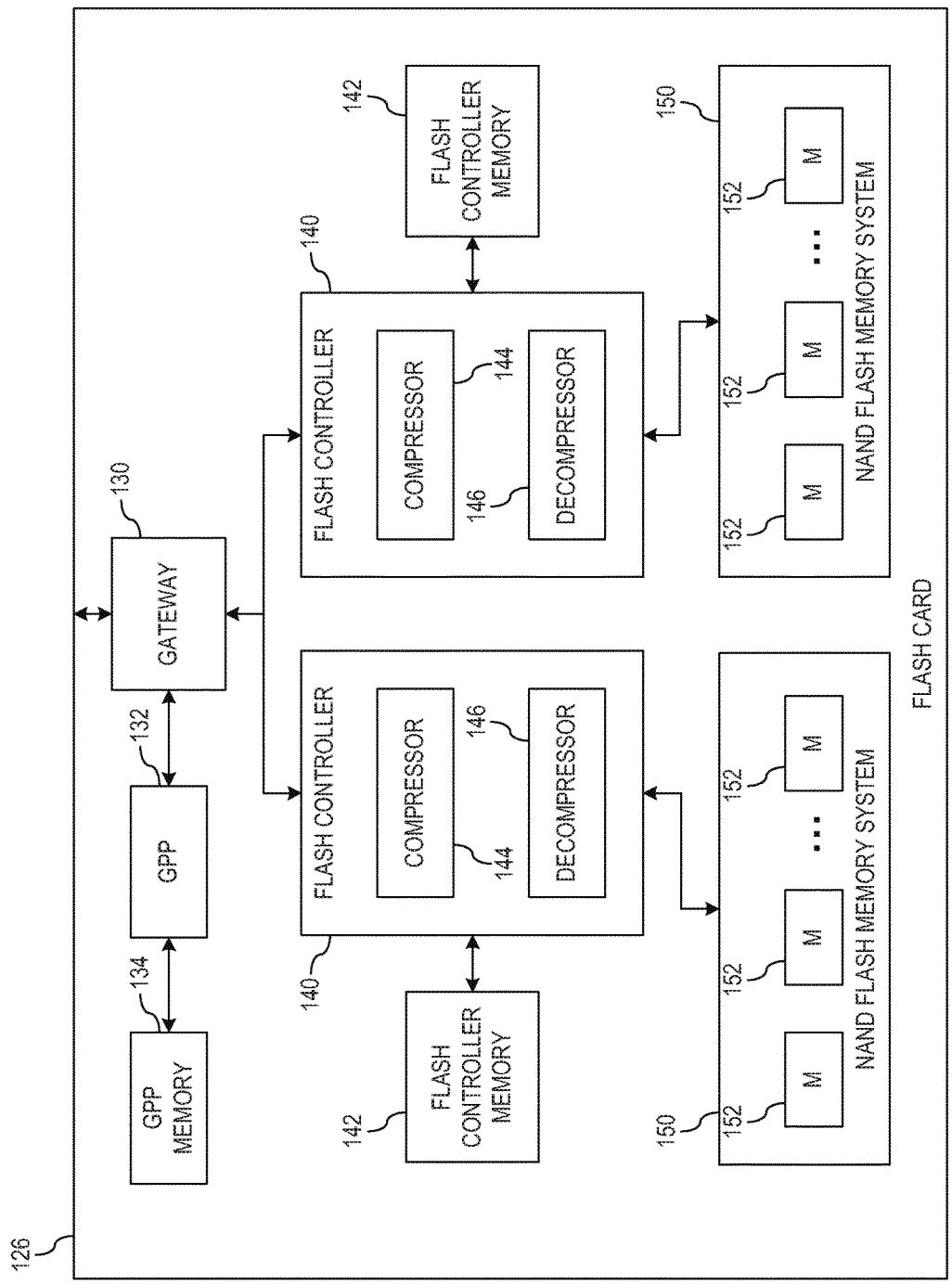
FIG. 1B is a more detailed block diagram of a flash card of the data storage system of FIG. 1A.

FIG. 1B depicts a more detailed block diagram of an exemplary embodiment of flash card 126 of data storage system 120 of FIG. 1A. Flash card 126 includes gateway 130 that serves as an interface between flash card 126 and RAID controllers 124. Gateway 130 is coupled to general-purpose processor (GPP) 132, which can be configured by program code) to perform pre-processing on IOPs received by gateway 130 and/or to schedule servicing of the IOPs by flash card 126. GPP 132 is coupled to GPP memory 134 (e.g., Dynamic Random Access Memory (DRAM)) that can conveniently buffer data created, referenced and/or modified by GPP 132 in the course of its processing or data flowing through gateway 130 destined for one or more of flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150.

Flash controllers 140 service these IOPs, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an IOP received by flash controller 140 from a host device, such as processor system 102 in FIG. 1A, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. The flash translation layer translates LBAs received from a RAID controller, such as RAID controller 124 in FIG. 1A, into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of board-mounted flash memory modules, for example, Single Level Cell (SLC), Multi-Level Cell (MLC), Three Level Cell (TLC), or Quad Level Cell (QLC) NAND flash memory modules. The effective storage capacity provided by flash memory storage devices 152 is preferably increased through the implementation of data compression, for example, by flash controllers 140 and/or high level controllers, such as GPPs 132, RAID controllers 124 or SMCs 123. In the illustrated embodiment, data compression and decompression is implemented at least in flash controllers 140 by compressor 144 and decompressor 146.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two- or three-dimensional array of NAND flash memory cells. As indicated in FIG. 2, the memory cells within memory array 202 are physically arranged in multiple blocks 204, each in turn including multiple physical pages 206.

As is known to those skilled in the art, NAND flash memory, such as that employed in memory array 202, must be erased prior to being programmed. Further, NAND flash memory is generally constrained by its construction such that the smallest granule of storage that can be erased is block 204 and the smallest granule of storage that can be accessed by a read or write IOP is fixed at the size of single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus correspond to multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Those of ordinary skill in the art will appreciate that the hardware in FIGS. 1A, 1B, and 2 may vary depending on the implementation. Other internal hardware or peripheral devices, equivalent non-volatile memory, or optical disk drives and the like, may be used in addition to or in place of the hardware depicted in FIGS. 1A, 1B, and 2. Also, the processes of the illustrative embodiments may be applied to a multiprocessor data processing system without departing from the spirit and scope of the present invention.

Figure 3:
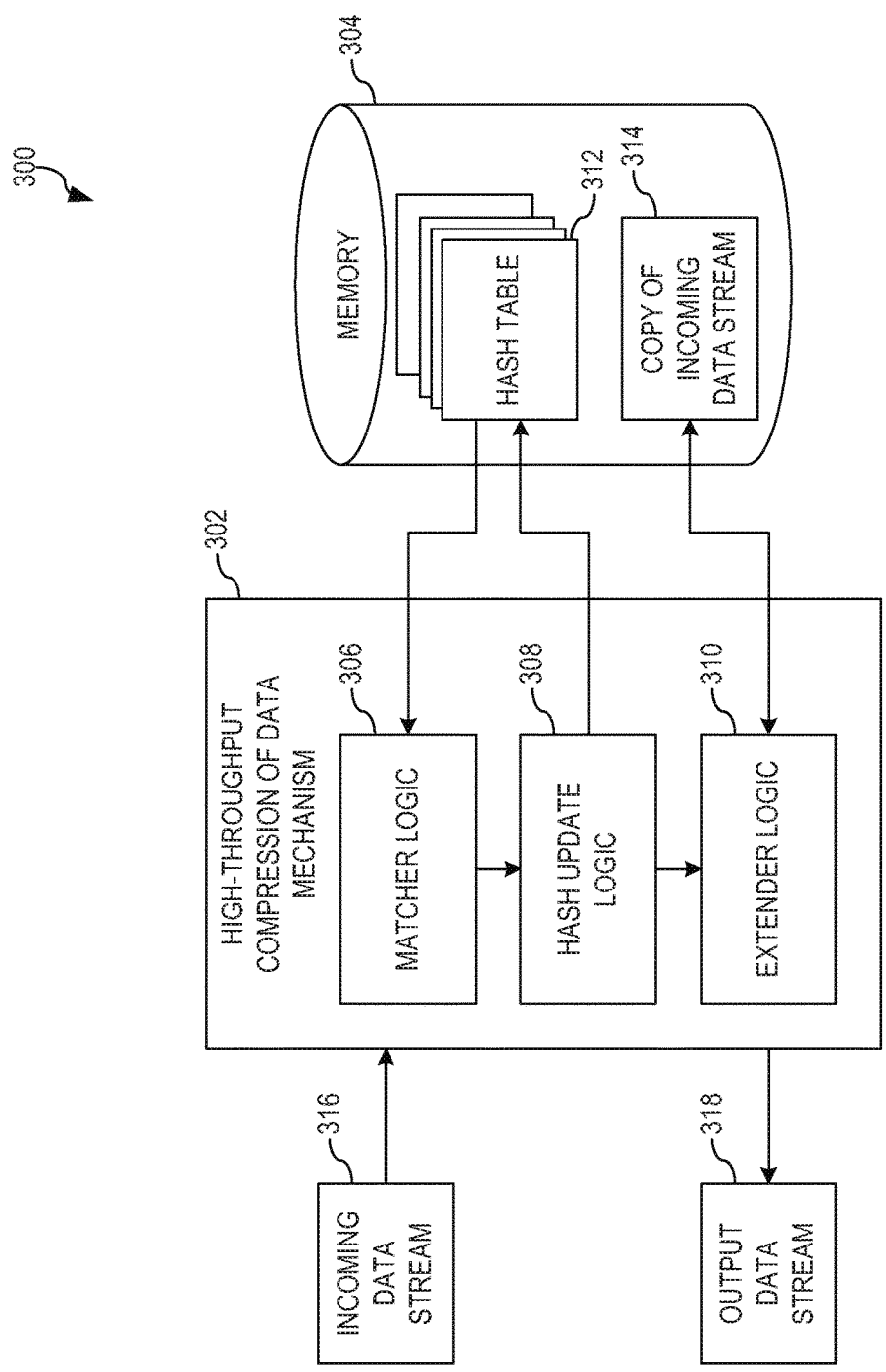
FIG. 3 depicts an exemplary block diagram of a high-throughput compression of data mechanism in accordance with an illustrative embodiment.

FIG. 3 depicts an exemplary block diagram of a high-throughput compression of data mechanism in accordance with an illustrative embodiment. High-throughput compression of data mechanism 300 comprises modified Lempel-Ziv77 (LZ77) compression mechanism 302, such as compressor 144 of FIG. 1B, and memory M 304. LZ77 compression mechanism 302 comprises matcher logic 306, hash update logic 308, and extender logic 310; and memory M 304 comprises a set of hash tables 312 and copy of the incoming data stream 314.

In operation, matcher logic 306 receives incoming data stream 316. Matcher logic 306 analyzes incoming data stream 316 in 4-byte chunks and thus, denotes a current position (pos) value as pos=0, 4, 8, 12, . . . 4096 in incoming data stream 316. For each 4 bytes, matcher logic 306 compares the incoming data with the contents of the set of hash tables 312. The set of hash tables 312 comprises a coarse granularity history of the data that has been seen, which allows matcher logic 306 to identify whether short matches of 4 bytes have occurred somewhere earlier in incoming data stream 316. Matcher logic 306 looks for a 4-byte match for the current 4 bytes at a byte offset j=0, the current 4 bytes at a byte offset j=1, the current 4 bytes at a byte offset j=2, and the current 4 bytes at a byte offset j=3 in order to determine whether these 4-byte data patterns have been observed earlier in the data. That is, matcher logic 306 performs the following analysis:

Current pattern at byte offset j=0: data_in[pos:pos+3],
Current pattern at byte offset j=1: data_in[pos:pos+4],
Current pattern at byte offset j=2: data_in[pos:pos+5], and
Current pattern at byte offset j=3: data_in[pos:pos+6].

Matcher logic 306 provides output as a 4 bit vector of match flags (match) which indicate whether a match was detected for byte offset j=0, 1, 2, and 3 and a vector of match positions (match_pos) which indicate the position in the stream at which the matches were detected.

Specifically, matcher logic 306, using a hash function, computes a key value (Key[j]) for each of the current 4-byte data patterns at byte offsets j=0, 1, 2, and/or 3. Matcher logic 306 then makes a look-up using each of the 4 keys into each of the 4 hash tables (16 look-ups in total), to obtain corresponding hash table entries which consists of a 4-byte data pattern (ht_data) and position data (ht_pos). Note that the ht_pos field may be set to some arbitrary value (e.g. 'x') to indicate that this particular hash table entry has not been written thus far.

Again, there are 4 different hash tables. The j-th hash table stores the patterns (and positions) which have been seen earlier in the data at the j-th byte offset. Note that matcher logic 306 must read 4 times from each of the hash tables since matches do not always occur at the same byte offset. This requires that each hash table be essentially implemented 4 times and mirrored in order to enable 16 reads from the tables to occur in parallel. Thus, there are 16 hash tables in the set of hash tables 312.

For each of the 4 current data patterns at different byte offsets, matcher logic 306 compares the current data with the ht_data from each of the 4 hash tables and verifies that a collision has not occurred. If the ht_data is indeed equal to the current data, matcher logic 306 looks to see if a match has occurred earlier in the stream (i.e. pos is not equal to x). If matcher logic 306 determines that a match is detected for byte offset j, matcher logic 306 sets the corresponding match flag match[j] to be equal to 1, and the corresponding entry in the match position vector match_pos[j]=ht_pos. If matcher logic 306 determines that more than one match occurs for a particular byte offset (i.e. a match is detected from more than one of the hash tables), matcher logic 306 selects the match with the largest position. If matcher logic 306 determines that no match is detected, matcher logic 306 sets the match flag match[k]=0, and the corresponding entry in the match position vector match_pos[j]=x.

Where matcher logic 306 reads from the set of hash tables 312, hash update logic 308 simply writes to the set of hash tables 312. Hash update logic 308 updates the set of hash tables 312 with the 4-byte data patterns from incoming data stream 316 that have been seen in the current clock cycle, allowing matcher logic 306 to detect matches in later clock cycles which point back to the current data being observed.

Hash update logic 308 may either compute a hash (Key [j]) for the current data pattern at each byte offset j=0, 1, 2, and 3 using the same hash function as that used by matcher logic 306 or simply utilize the hash values generated by matcher logic 306. For byte offset j, hash update logic 308 then writes the j-th hash table updating the entry corresponding to Key[j], setting the ht_data field to be equal to the current data at byte offset j and the pos field to be equal to (pos+j). Note that all writes performed by hash update logic 308 may occur in parallel.

Extender logic 310 uses input from matcher logic 306 to perform Lempel-Ziv encoding. Extender logic 310 keeps a copy of the incoming data stream 314 in memory M 304 for use in trying to extend the 4-byte matches provided by matcher logic 306 into matches up to some fixed length (max_match_length). Extender logic 310 outputs data 318 that is not matched as literals, while extender logic 310 outputs data 318 that is matched as a (length,distance) pair where length indicates the number of bytes that were matched and distance is the distance back in the stream at which the match begins (relative to the current position).

In order to do this compressed output 318, in each clock cycle, extender logic 310 copies the current 4 bytes of incoming data, data_in[pos:pos+3], into the copy of the incoming data stream 314 at memory M 304 [pos+pos+3]. The copy of the incoming data stream 314 allows extender logic 310 to try to extend the short 4-byte matches coming from matcher logic 306 into longer matches.

Extender logic 310 may then perform one of two different operations depending on whether a binary flag called 'active_match' is either high or low. When the binary flag is in an 'inactive state' (i.e. active_match=0), extender logic 310 iterates through the bytes offsets j=0, 1, 2, and 3 looking for the first match (i.e. the first value of j for which match[j]=1). If extender logic 310 determines that a match is not found for offset j, extender logic 310 outputs the corresponding current data byte data_in[pos+j] as a literal. If extender logic 310 determines that a match is found for offset j, extender logic 310 sets the active state flag (active_match=1) and records the position at which the match occurred (active_pos=match_pos[j]), the number of current data bytes in this cycle that were matched (active_len=4−j), and the distance of the match position relative to the current position in the stream (active_dist=pos+j−match_pos[j]). Extender logic 310 then increments the position (pos) in the stream by 4 bytes (pos=pos+4) and moves onto the next cycle.

Since the minimum length of a match in the encoding performed by extender logic 310 is always equal to 4, extender logic 310 knows that if a match occurs at any of the byte offsets, all of the bytes in the current 4-byte window will be contained in the match and thus, extender logic 310 does not need to consider the possibility that a match will begin and end within the same cycle. Therefore, once the active state is activated in the current cycle, extender logic 310 immediately moves onto the next cycle.

When the binary flag is in an 'active state' (i.e. active_match=1), extender logic 310 compares the new incoming 4-byte data (data_in[pos:pos+3]) with the 'active data' (i.e. the pattern stored in copy of the incoming data stream 314 in memory M 304 at the active position which was set in the previous cycle) and checks to see by how many bytes the match may be extended (k).

The extension value (k) is a number from 0 to 4 and extender logic 310 determines the extension value (k) as follows, where '!=' denotes 'not equal to':

If X[pos]!=M[active_pos],
Then k=0;
If X[pos]=M[active_pos] AND
X[pos+1]!=M[active_pos+1]
Then k=1;
If X[pos]=M[active_pos] AND
X[pos+1]=M[active_pos+1] AND
X[pos+2]!=M[active_pos+2]
Then k=2;
If X[pos]=M[active_pos] AND
X[pos+1]=M[active_pos+1] AND
X[pos+2]=M[active_pos+2] AND
X[pos+3]!=M[active_pos+3]
Then k=3; or
If X[pos]=M[active_pos] AND
X[pos+1]=M[active_pos+1] AND
X[pos+2]=M[active_pos+2] AND
X[pos+3]=M[active_pos+3]
Then k=4.

If extender logic 310 determines that k is equal to 4, then all 4 current data bytes match with the data in memory and the match can be extended by the maximum 4 bytes. In this case, extender logic 310 simply increments the active_len (which tracks the running length of the match) by 4 and moves onto the next cycle. If extender logic 310 determines that k is less than 4, then extender logic 310 determines that a match may not be extended to cover all 4 of the current bytes and ends the match and outputs a (length,distance) pair where length is given by active_len+k (i.e. the length of the running match plus the number of bytes that matches in this cycle) and the distance is given by active_dist. Once the match is ended, extender logic 310 resets the binary flag to an 'inactive state' (i.e. active_match=0), then extender logic 310 looks too see whether a new match may be started from any of the byte positions j=k, k+1, . . . , 3. If extender logic 310 determines that a match does not exist at byte offset match[j] then a literal is sent to the output. If extender logic 310 determines that a match does exist, then extender logic 310 enters the active match state as described before.

Thus, the present invention provides an improvement to the extender logic so as to implement a high-throughput compression of data mechanism and reduce the size of the extender logic on a FPGA. Therefore, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the tatter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Figure 4:
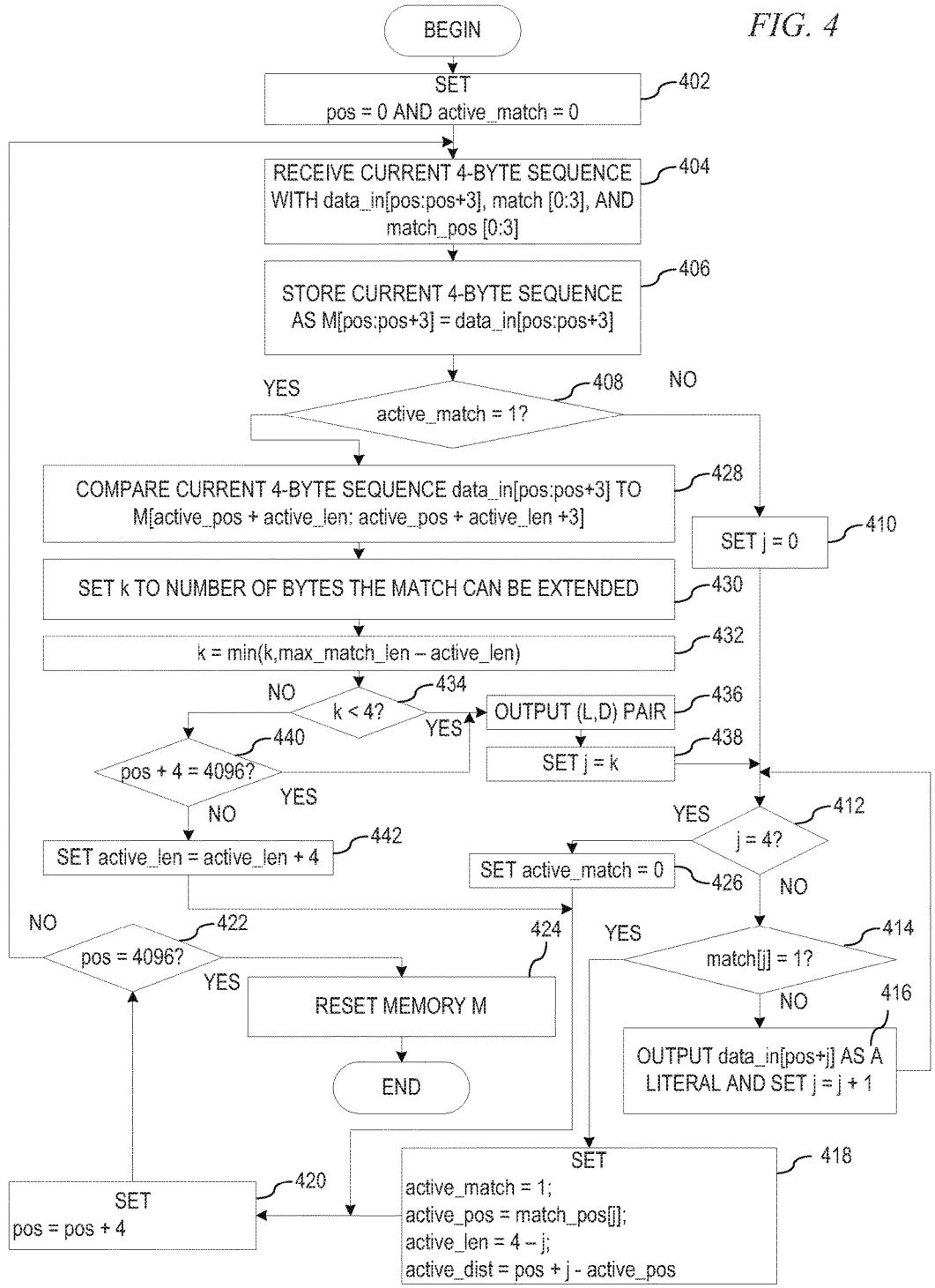
FIG. 4 depicts a flowchart of the operation performed by a high-throughput compression of data mechanism in accordance with an illustrative embodiment.

FIG. 4 depicts a flowchart of the operation performed by a high-throughput compression of data mechanism in accordance with an illustrative embodiment. As the operation begins, extender logic within the high-throughput compression of data mechanism initially sets a position variable (pos) to zero (0) and sets an active match variable (active_match) to zero (0) (step 402). The extender logic receives a current 4-byte sequence of an incoming data stream data_in [pos:pos+3], an identification, if any, of which position in the 4 bytes starts the match (match) [0:3], and a match position (match_pos) [0:3], if any, in the incoming data stream where the match occurred associated with the start position, i.e. 0 to 4 KB−1 (step 404). Upon receiving the current 4-byte sequence analysis, regardless of whether there is a match or not, the extender logic stores the current 4-byte sequence as M[pos: pos+3] equal to data_in[pos:pos+3] in a copy of the incoming data stream in memory M (step

406). The extender logic determines whether the active match variable (active_match) is set to one (1) (step 408).

If at step 408 extender logic determines that the active match variable (active_match) is not a one (1), i.e. a zero (0), the extender logic sets an increment variable (j) equal to zero (0) (step 410). The extender logic determines whether the increment variable (j) is equal to 4 (step 412). If at step 412 extender logic determines that the increment variable is not equal to 4, the extender logic determines whether a match at the increment variable (j) position (match[j]) is equal to one (1) (step 414). If at step 414 the extender logic determines that the match[j] is not equal to 1, the extender logic outputs data_in[pos+j] as a literal and sets the increment variable (j) equal to j+1 (step 416), with the operation returning to step 412. If at step 414 the extender logic determines that match[j] is equal to one (1), then the extender logic sets the active match variable (active_match) equal to one (1), sets an active position variable (active_pos) equal to the match position (match_pos) of the increment variable (j) (match_pos[j]), sets an active length variable (active_len) equal to 4 minus the increment variable (j) (4−j), and sets an active distance variable (active_dist) equal to the position variable (pos) plus the increment variable (j) minus the active position variable (active_pos) (pos+j−active_pos) (step 418). The extender logic then sets the position variable (pos) to pos+4 (step 420) and determines whether the updated position variable (pos) is equal to 4096, i.e. 4 kilobytes (kB) (step 422). If at step 422 the extender logic determines that the updated position variable (pos) is equal to 4096, then the extender logic resets the copy of the incoming data stream in memory M (step 424), with the operation ending thereafter. If at step 422 the extender logic determines that the updated position variable (pos) is not equal to 4096, the operation returns to step 404 to receive and process the next 4 bytes from the matching logic.

Returning to step 412, if at step 412 the extender logic determines that the increment variable is equal to 4, the extender logic sets the active match variable (active_match) equal to zero (0) (step 426), with the operation proceeding to step 420 thereafter. Returning to step 408, if the extender logic determines that the active match variable (active_match) is a one (1), the extender logic compares the current 4 byte sequence, data_in[pos:pos+3], with the data in the copy of the incoming data stream in the memory M at the active position (active_pos) with a length offset M[active_pos+active_len: active_pos+active_len+3] (step 428). The extender logic further sets a constraint variable (k) to a number of bytes for which the match can be extended (between 0 and 4) (step 430). The extender logic then sets or resets the constraint variable (k) to a minimum of the current value of the constraint variable (k) or a value of the difference between a maximum match length (max_match_len) and the active length (active_len), i.e. max_match_len−active_len (step 432).

The extender logic determines whether the set value for the constraint variable (k) is less than 4 (k<4) (step 434). If at step 434 the extender logic determines that the constraint variable (k) is less than 4 indicating that the match may not be extended to cover all of the 4 bytes currently being considered, then the extender logic outputs a length (L), distance (D) pair indicating a match to a previous pattern in the incoming data stream (step 436). The match indicates a length (L) of the matching pattern that is set to the active length (active_len) plus the constraint variable (k), i.e. active_len+k, at a distance (D) that is set to the active distance (active_dist). The extender logic then sets the increment variable (j) equal to the constraint variable (k) (step 438), with the operation proceeding to step 412 thereafter.

Returning to step 434, if at step 434 the extender logic determines that the constraint variable (k) is not less than 4 indicating the match may be further extended to cover all of the 4 bytes currently being considered, the extender logic determines whether the position variable (pos)+4 is equal to 4096 (step 440). If at step 440 the extender logic determines that the position variable (pos) 4 is equal to 4096, the operation proceeds to step 436. If at step 440 the extender logic determines that the position variable (pos)+4 fails to be equal to 4096, the extender logic sets the active length variable (active_len) to the active_len+4 (step 442), with the operation proceeding to step 420 thereafter.

Figure 5A:
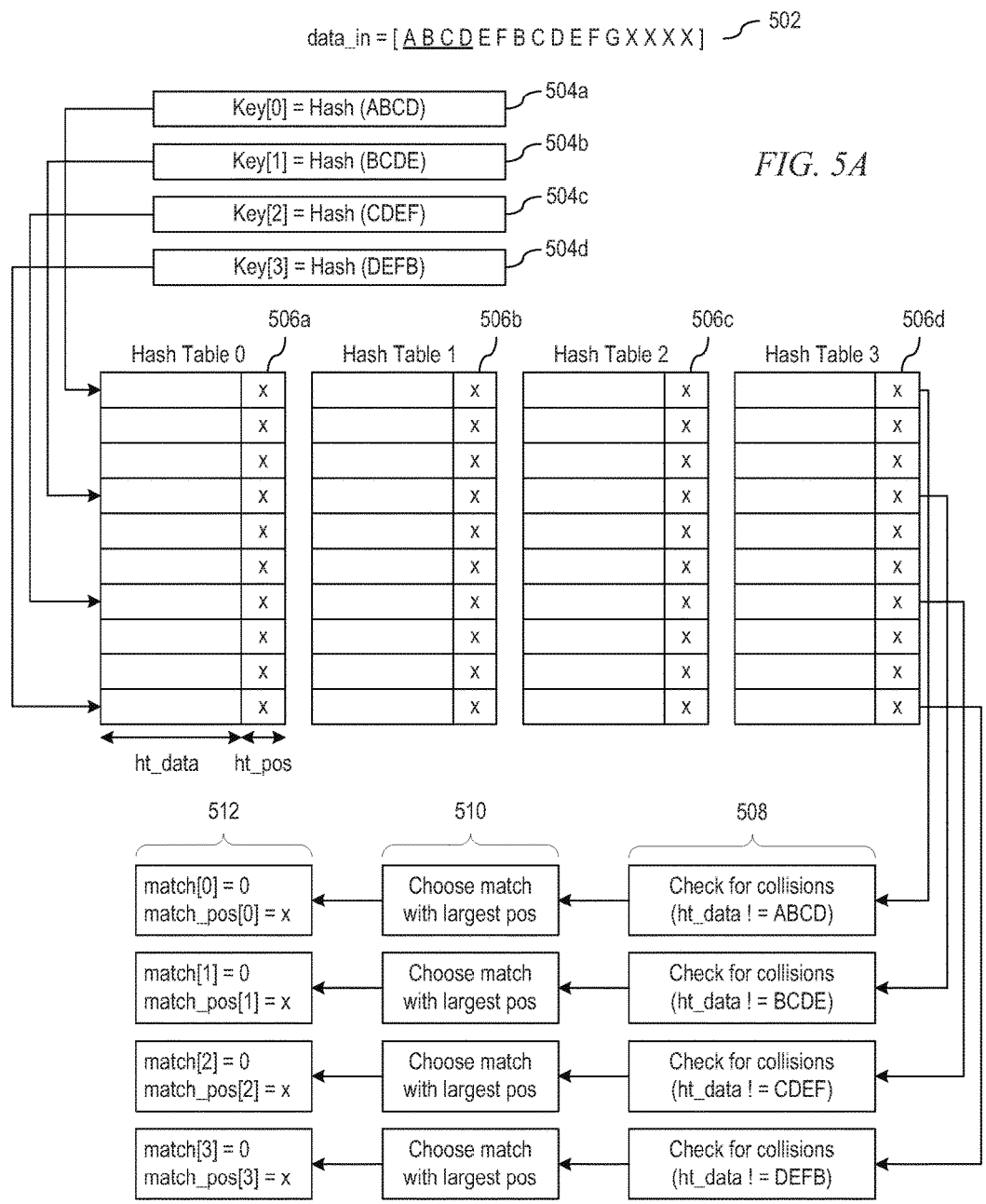
FIGS. 5A-5C describe the processing performed by the high-throughput compression of data mechanism in a first cycle in accordance with an illustrative embodiment.
Figure 5B:
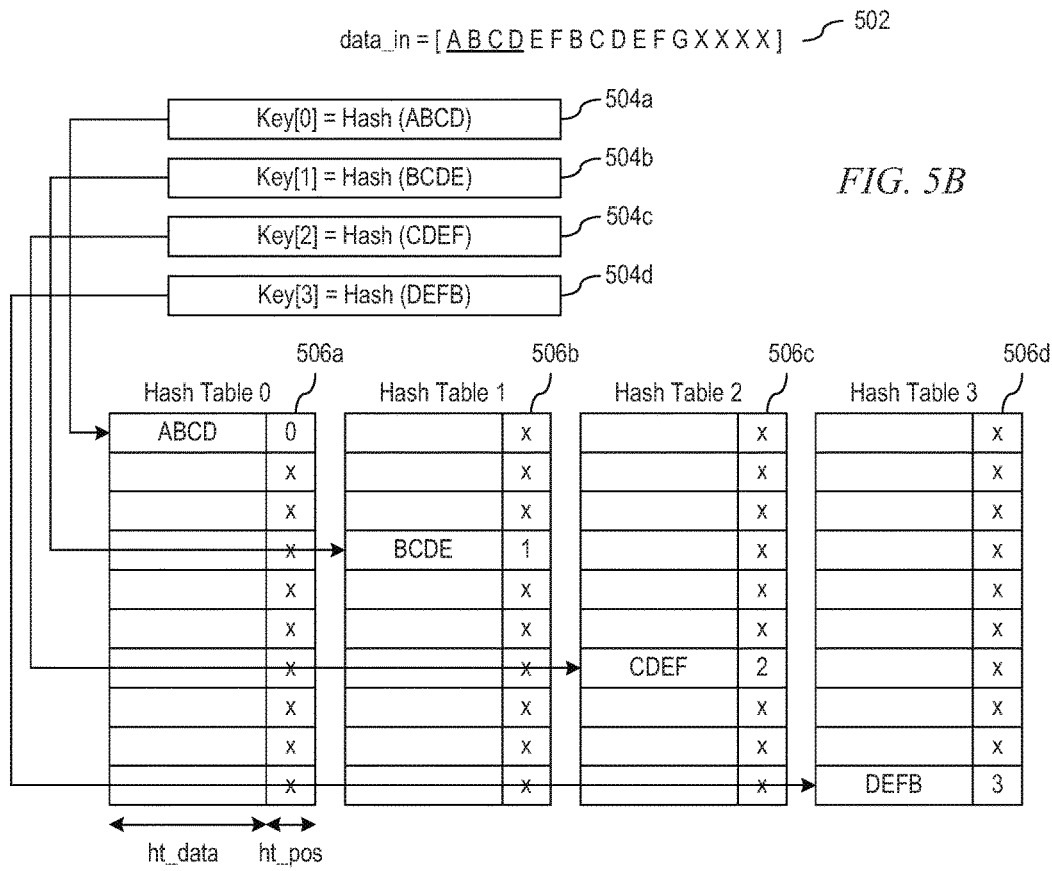
Figure 5C:
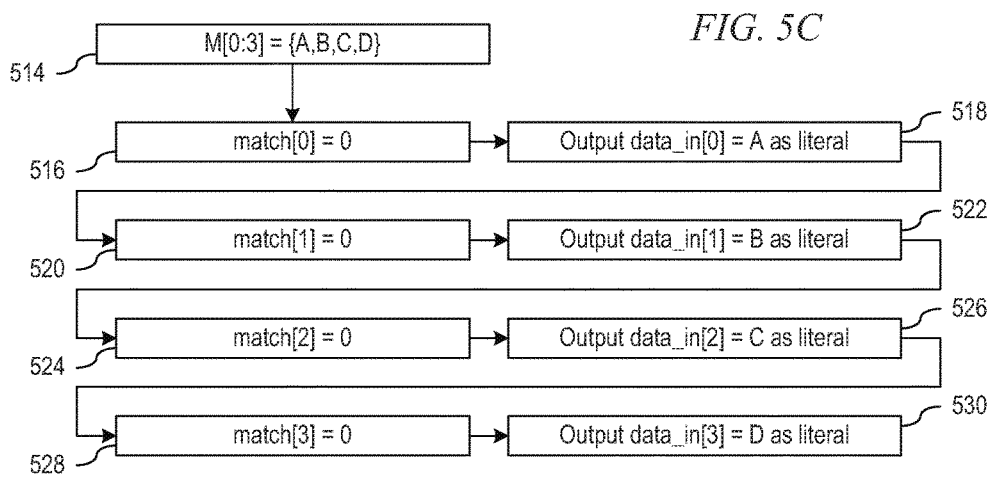
Figure 6A:
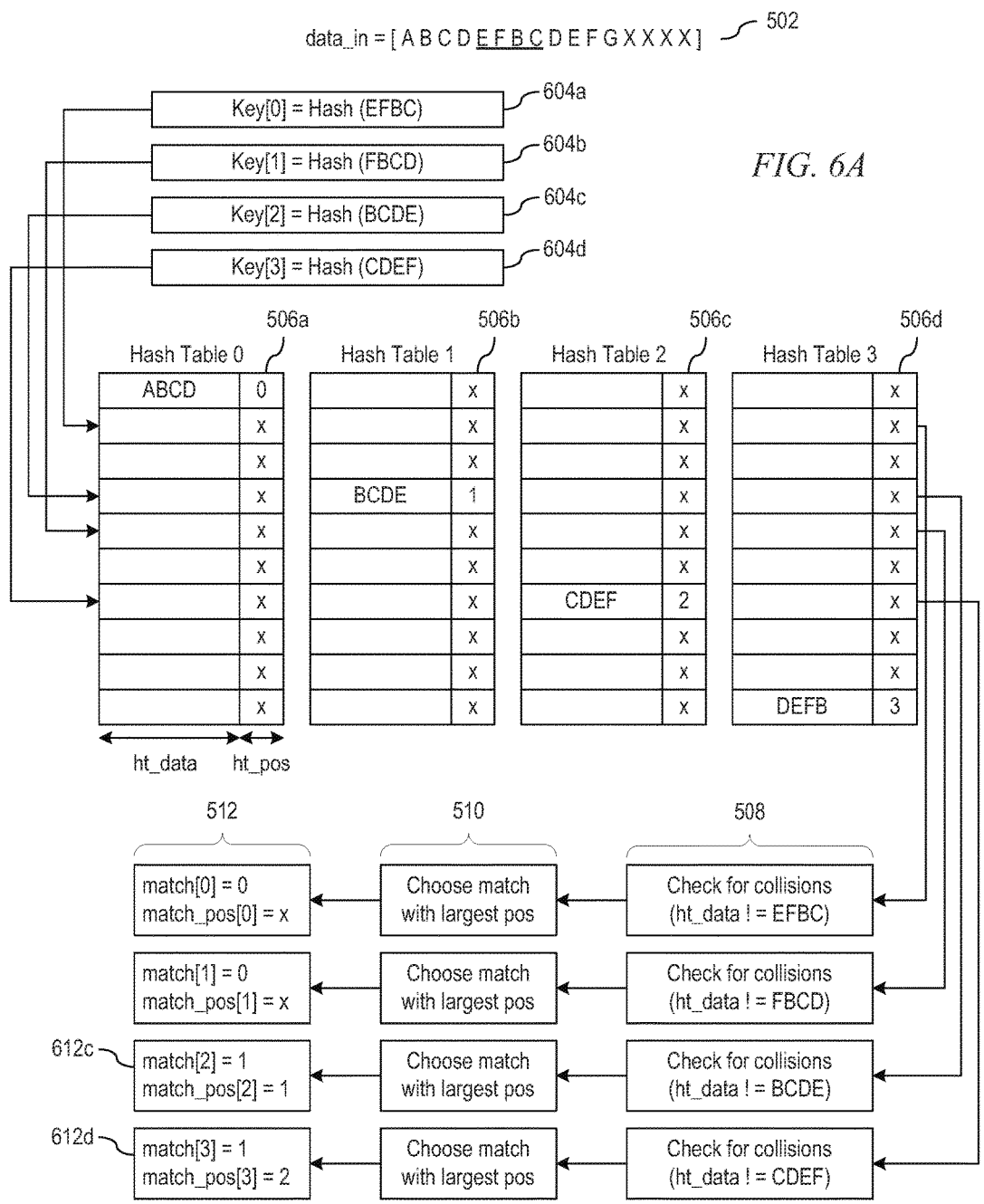
FIGS. 6A-6C describe the processing performed by the high-throughput compression of data mechanism in a second cycle in accordance with an illustrative embodiment.
Figure 6B:
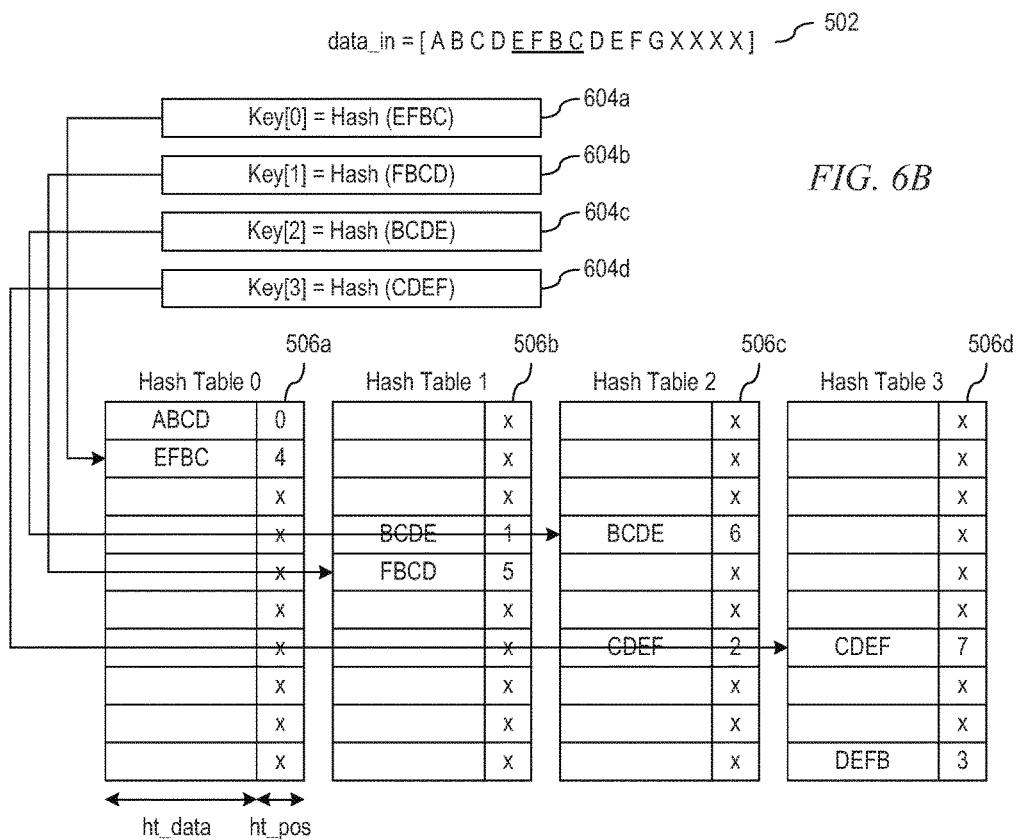
Figure 6C:
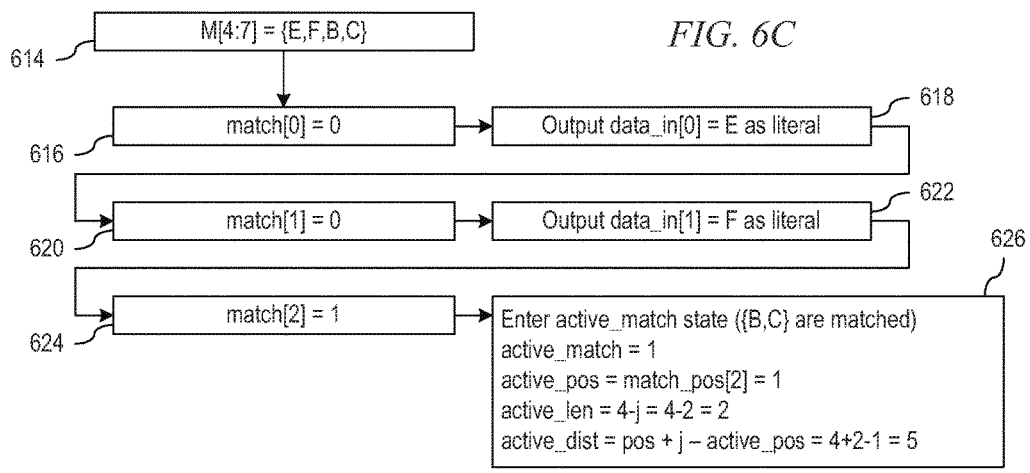
Figure 7A:
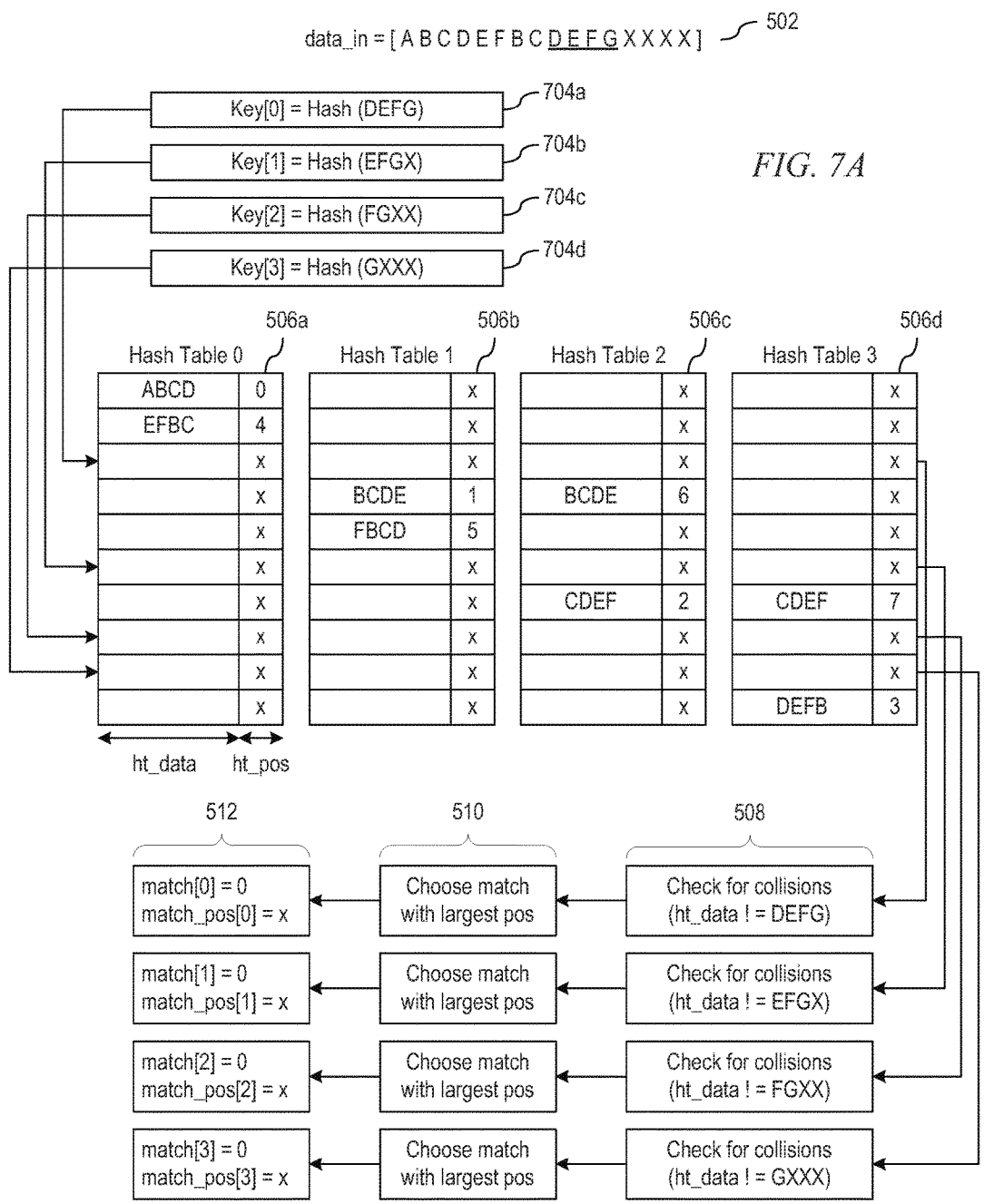
FIGS. 7A-7C describe the processing performed by the high-throughput compression of data mechanism in a third cycle in accordance with an illustrative embodiment.
Figure 7B:
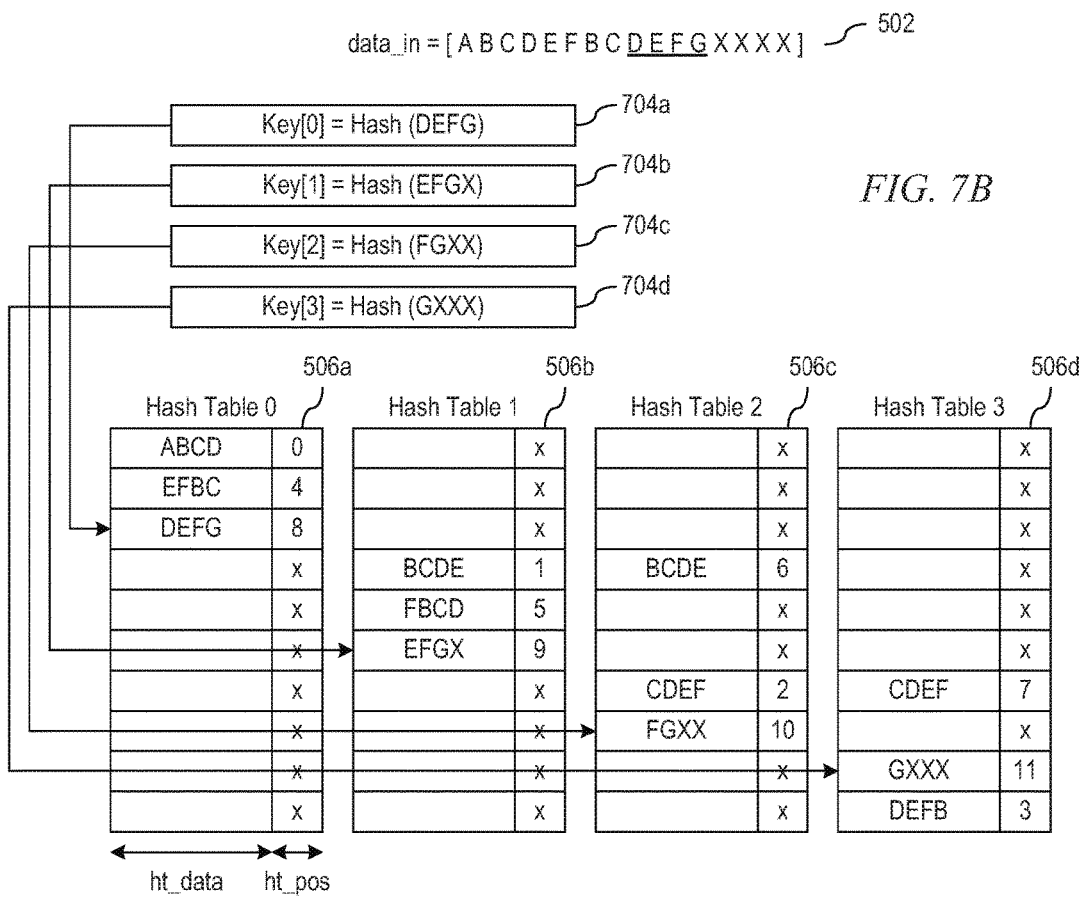
Figure 7C:
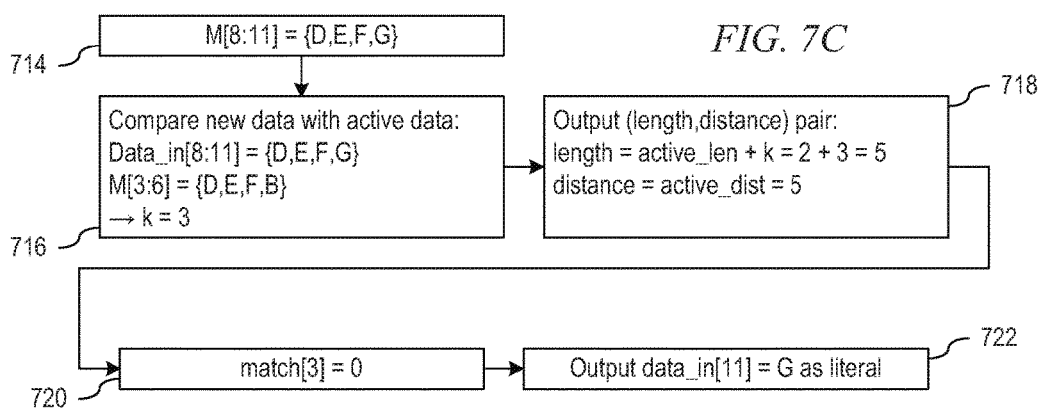

In order to provide context for the process implemented by high-throughput compression of data mechanism 300 of FIG. 3 and described in the flowchart of FIG. 4, consider, for example, the processing of an incoming data stream is described with regard to FIGS. 5-7 in accordance with an illustrative embodiment. FIGS. 5A-5C describe the processing performed by the high-throughput compression of data mechanism in a first cycle (cycle 0), FIGS. 6A-6C describe the processing performed by the high-throughput compression of data mechanism in a second cycle (cycle 1), and FIGS. 7A-7C describe the processing performed by the high-throughput compression of data mechanism in a third cycle (cycle 2).

With regard to FIG. 5A, the matcher logic of the high-throughput compression of data mechanism receives incoming data stream 502 of A B C D E F B C D E F G X X X X. The last four bytes of incoming data stream may be any bytes but, in this example, are set to X X X X only to provide an indication that the incoming data stream 502 proceeds further and to illustrate how the bytes of the incoming data stream 502 are handled by the high-throughput compression of data mechanism. As described previously, the matcher logic analyzes incoming data stream 502 in 4-byte chunks and thus, in this example, starts with the 4 bytes A B C D. Using a hash function, the matcher logic computes a key value (Key[j]) for each of the current 4-byte data patterns at byte offsets j=0, 1, 2, and 3, as follows:

Current pattern at byte offset j=0: data_in[pos:pos+3],
Current pattern at byte offset j=1: data_in[pos:pos+4],
Current pattern at byte offset j=2: data_in[pos:pos+5], and
Current pattern at byte offset j=3: data_in[pos:pos+6].

Therefore, since initially pos is equal to 0, the matcher logic generates for Key [0] a hash (ABCD) 504a, for Key [1] a hash (BCDE) 504b, for Key [2] a hash (CDEF) 504c, and for Key [3] a hash (DEFB) 504d. For each of the four hashed values 504a-504d, the matcher logic compares the hashed values 504a-504d with the contents of the set of hash tables 506a-506d. Again, the set of hash tables 506a-506d comprises a coarse granularity history of the data that has been seen, which allows the matcher logic to identify whether short matches of 4 bytes have occurred somewhere earlier in incoming data stream 502. The matcher logic looks for a 4-byte match for the current 4 bytes at a byte offset j=0 in hash table 506a, the current 4 bytes at a byte offset j=1 in hash table 506b, the current 4 bytes at a byte offset j=2 in hash table 506c, and the current 4 bytes at a byte offset j=3 in hash table 506d in order to determine whether these 4-byte data patterns have been observed earlier in the data.

Again, there are 4 different hash tables. The j-th hash table stores the patterns (and positions) which have been seen earlier in the data at the j-th byte offset. Note that the matcher logic must read 4 times from each of the hash tables since matches do not always occur at the same byte offset. Although not shown, this requires that each hash table be essentially implemented 4 times and mirrored in order to enable 16 reads from the tables to occur in parallel. Thus, there are 16 hash table in the set of hash table.

For each of the 4 current data patterns at different byte offsets, the matcher logic compares the current data with the ht_data from each of the 4 hash tables and verifies that a collision has not occurred, as shown in processes 508. If the ht_data is indeed equal to the current data, the matcher logic looks to see if a match has occurred earlier in the stream (i.e. pos is not equal to x). If the matcher logic determines that more than one match occurs for a particular byte offset (i.e. a match is detected from more than one of the hash tables), the matcher logic selects the match with the largest position, as is shown in processes 510. If the matcher logic determines that a match is detected for byte offset j, the matcher logic sets the corresponding match flag match[j] to be equal to 1, and the corresponding entry in the match position vector match_pos[j]=ht_pos; or if the matcher logic determines that no match is detected, the matcher logic sets the match flag match[k]=0, and the corresponding entry in the match position vector match_pos[j]=x, as is shown in processes 512.

With regard to FIG. 5B, the hash update logic may either compute a hash (Key[j]) for the current data pattern at each byte offset j=0, 1, 2, and 3 using the same hash function as that used by the matcher logic or simply utilizes the hash values generated by the matcher logic. Utilizing the hashed values 504a-540d, the hash update logic updates the set of hash tables 506a-506h with the 4-byte data patterns from incoming data pattern 502 that have been seen in the current clock cycle, allowing the matcher logic to detect matches in later clock cycles Which point back to the current data being observed. Therefore, the hash update logic stores hash (ABCD) 504a in hash table 506a, hash (BCDE) 504b in hash table 506b, hash (CDEF) 504c in hash table 506c, and hash (DEFB) 504d in hash table 506d. Note that all writes performed by the hash update logic may occur in parallel.

With regard to FIG. 5C and the process described in FIG. 4, in the first clock cycle (cycle 0) the extender logic sets position variable (pos) to zero (0) and sets an active match variable (active_match) to zero (0). Upon receiving the current 4-byte sequence analysis from the matcher logic, the extender logic stores the current 4-byte sequence as M[0:3] A,B,C,D (element 514) as a copy of the incoming data stream in the memory M. The extender logic then determines whether the active match variable (active_match) is set to one (1). In this first clock cycle, the active match variable (active_match) is zero (0).

The extender logic sets the increment variable (j) equal to zero (0) and determines whether the increment variable (j) is equal to 4. Since j=0, the extender logic determines whether match[0] is equal to one (1) (element 516). Since this is the first clock cycle, match[0] is not equal to 1 and the extender logic outputs data_in[0] as a literal A (element 518). The extender logic sets the increment variable (j) equal to j+1, i.e. 0+1=1, and the extender logic determines whether the increment variable (j) is equal to 4. Since j=1, the extender logic determines whether match[1] is equal to one (1) (element 520). Since this is the first clock cycle, match[1] is not equal to 1 and the extender logic outputs data_in [1] as a literal B (element 522). The extender logic sets the increment variable (j) equal to j+1, i.e. 1+1=2, and the extender logic determines whether the increment variable (j) is equal to 4. Since j=2, the extender logic determines whether match[2] is equal to one (1) (element 524). Since this is the first clock cycle, match[2] is not equal to 1 and the extender logic outputs data_in [2] as a literal C (element 526). The extender logic sets the increment variable (j) equal to j+1, i.e. 2+1=3, and the extender logic again determines whether the increment variable (j) is equal to 4. Since j=3, the extender logic determines whether match[3] is equal to one (1) (element 528). Since this is the first clock cycle, match[3] is not equal to 1 and the extender logic outputs data_in [3] as a literal D (element 530). The extender logic sets the increment variable (j) equal to j+1, i.e. 3+1=4 and the extender logic again determines whether the increment variable (j) is equal to 4. Now that the increment variable (j) is equal to 4, the extender logic sets/resets the active match variable (active_match) equal to zero (0) and sets the position variable (pos) to pos+4, i.e. 0+4=4, and determines whether the updated position variable (pos) is equal to 4096. Since the updated position variable (pos) is 4 and not equal to 4096, the extender logic proceeds to receive and process the next 4 bytes in the next clock cycle from the matching logic, i.e. the process proceeds to FIGS. 6A-6C.

With regard to FIG. 6A, the matcher logic analyzes the next 4-byte chunk of incoming data stream 502, e.g. the 4 bytes E F B C. Using a hash function, the matcher logic computes a key value (Key[j]) for each of the current 4-byte data patterns at byte offsets j=0, 1, 2, and 3, as follows:

Current pattern at byte offset j=0: data_in[pos:pos+3],
Current pattern at byte offset j=1: data_in[pos:pos+4],
Current pattern at byte offset j=2: data_in[pos:pos+5], and
Current pattern at byte offset j=3: data_in[pos:pos+6].

Therefore, the matcher logic generates for Key [0] a hash (EFBC) 604a, for Key [1] a hash (FBCD) 604b, for Key [2] a hash (BCDE) 604c, and for Key [3] a hash (CDEF) 604d. For each of the four hashed values 604a-604d, the matcher logic compares the hashed values 604a-604d with the contents of the set of hash tables 506a-506d. The matcher logic looks for a 4-byte match for the current 4 bytes at a byte offset j=0 in hash table 506a, the current 4 bytes at a byte offset j=1 in hash table 506b, the current 4 bytes at a byte offset j=2 in hash table 506c, and the current 4 bytes at a byte offset j=3 in hash table 506d in order to determine whether these 4-byte data patterns have been observed earlier in the data.

For each of the 4 current data patterns at different byte offsets, the matcher logic compares the current data with the ht_data from each of the 4 hash tables and verifies that a collision has not occurred, as shown in processes 508. If the ht_data is indeed equal the current data, the matcher logic looks to see if a match has occurred earlier in the stream (i.e. pos is not equal to x). If the matcher logic determines that more than one match occurs for a particular byte offset (i.e. a match is detected from more than one of the hash tables), the matcher logic selects the match with the largest position, as is shown in processes 510. If the matcher logic determines that a match is detected for byte offset j, the matcher logic sets the corresponding match flag match[j] to be equal to 1, and the corresponding entry in the match position vector match_pos[j]=ht_pos; or if the matcher logic determines that no match is detected, the matcher logic sets the match flag match[k]=0, and the corresponding entry in the match position vector match_pos[j]=x, as is shown in processes 512. With regard to the specific example shown in FIG. 6A, the matcher logic determines a match for ht_data=BCDE and thus sets the corresponding match flag match[2] to be equal to 1 and the corresponding entry in the match position vector match_pos[2] equal to 1 as shown in element 612c. Similarly, the matcher logic determines a match for ht_data=CDEF and thus sets the corresponding match flag match[3] to be equal to 1 and the corresponding entry in the match position vector match_pos[3] equal to 2 as shown in element 612*d*.

With regard to FIG. 6B, the hash update logic may either compute a hash (Key[j]) for the current data pattern at each byte offset j=0, 1, 2, and 3 using the same hash function as that used by the matcher logic or simply utilize the hash values generated by the matcher logic. Utilizing the hashed values 604*a*-604*d*, the hash update logic updates the set of hash tables 506*a*-506*b* with the 4-byte data patterns from incoming data pattern 502 that have been seen in the current clock cycle, allowing the matcher logic to detect matches in later clock cycles which point back to the current data being observed. Therefore, the hash update logic stores hash (EFBC) 604*a* in hash table 506*a*, hash (FBCD) 604*b* in hash table 506*b*, hash (BCDE) 604*c* in hash table 506*c*, and hash (CDEF) 604*d* in hash table 506*d*. Note that all writes performed by the hash update logic may occur in parallel.

With regard to FIG. 6C and the process described in FIG. 4, in the second clock cycle (cycle 1), the extender logic receives the current 4-byte sequence analysis from the matcher logic and stores the current 4-byte sequence as M[4:7]=E,F,B,C (element 614) as a copy of the incoming data stream in the memory M. The extender logic then determines whether the active match variable (active_match) is set to one (1). In this second clock cycle, the active match variable (active_match) is zero (0).

The extender logic sets the increment variable (j) equal to zero (0) and determines whether the increment variable (j) is equal to 4. Since j=0, the extender logic determines whether match[0] is equal to one (1) (element 616). From the analysis received from the matcher logic, match[0] is not equal to 1 and the extender logic outputs data_in [0] as a literal E (element 618). The extender logic sets the increment variable (j) equal to j+1, i.e. 0+1=1, and the extender logic again determines whether the increment variable (j) is equal to 4. Since j=1, the extender logic determines whether match[1] is equal to one (1) (element 620). In this clock cycle, match[1] is not equal to 1 and the extender logic outputs data_in[1] as a literal F (element 622). The extender logic sets the increment variable (j) equal to j+1, i.e. 1+1=2, and the extender logic again determines whether the increment variable (j) is equal to 4. Since j=2, the extender logic determines whether match[2] is equal to one (1) (element 624). Based on the received analysis, match[2] is equal to one (1). Since match[2] is equal to one (1), the extender logic sets the active match variable (active_match) equal to one (1), sets an active position variable (active_pos) equal to the match position (match_pos) of the increment variable (j) (match_pos[2]), which from the analysis received from matching logic is 1, i.e. the 6$^{th}$ position matches the 1$^{st}$ position, sets an active length variable (active_len) equal to 4 minus the increment variable (j) (4−j), i.e. 4−2=2, and sets an active distance variable (active_dist) equal to the position variable (pos) plus the increment variable (j) minus the active position variable (active_pos) (pos+j−active_pos), i.e. 4+2−1=5 (element 626). The extender logic then sets the position variable (pos) to pos+4, i.e. 4+4=8, and determines whether the updated position variable (pos) is equal to 4096. Since the updated position variable (pos) is 8 and not equal to 4096, the extender logic proceeds to receive and process the next 4 bytes in the next clock cycle from the matcher logic, i.e. the process proceeds to FIGS. 7A-7C.

With regard to FIG. 7A, the matcher logic analyzes the next 4-byte chunk of incoming data stream 502, e.g. the 4 bytes D E F G. Using a hash function, the matcher logic computes a key value (Key[j]) for each of the current 4-byte data patterns at byte offsets j=0, 1, 2, and 3, as follows:
Current pattern at byte offset j=0: data_in[pos:pos+3],
Current pattern at byte offset j=1: data_in[pos:pos+4],
Current pattern at byte offset j=2: data_in[pos:pos+5], and
Current pattern at byte offset j=3: data_in[pos:pos+6].

Therefore, the matcher logic generates for Key [0] a hash (DEFG) 704*a*, for Key [1] a hash (EFGX) 704*b*, for Key [2] a hash (FGXX) 704*c*, and for Key [3] a hash (GXXX) 704*d*. For each of the four hashed values 704*a*-704*d*, the matcher logic compares the hashed values 704*a*-704*d* with the contents of the set of hash tables 506*a*-506*d*. The matcher logic looks for a 4-byte match for the current 4 bytes at a byte offset j=0 in hash table 506*a*, the current 4 bytes at a byte offset j=1 in hash table 506*b*, the current 4 bytes at a byte offset j=2 in hash table 506*c*, and the current 4 bytes at a byte offset j=3 in hash table 506*d* in order to determine whether these 4-byte data patterns have been observed earlier in the data.

For each of the 4 current data patterns at different byte offsets, the matcher logic compares the current data with the ht_data from each of the 4 hash tables and verifies that a collision has not occurred, as shown in processes 508. If the ht_data is indeed equal the current data, the matcher logic looks to see if a match has occurred earlier in the stream (i.e. pos is not equal to x). If the matcher logic determines that more than one match occurs for a particular byte offset (i.e. a match is detected from more than one of the hash tables), the matcher logic selects the match with the largest position, as is shown in processes 510. If the matcher logic determines that a match is detected for byte offset j, the matcher logic sets the corresponding match flag match[j] to be equal to 1, and the corresponding entry in the match position vector match_pos[1]=ht_pos; or if the matcher logic determines that no match is detected, the matcher logic sets the match flag match[k]=0, and the corresponding entry in the match position vector match_pos[j]=x, as is shown in processes 512.

With regard to FIG. 7B, the hash update logic may either compute a hash (Key[j]) for the current data pattern at each byte offset j=0, 1, 2, and 3 using the same hash function as that used by the matcher logic or simply utilize the hash values generated by the matcher logic. Utilizing the hashed values 704*a*-704*d*, the hash update logic updates the set of hash tables 506*a*-506*b* with the 4-byte data patterns from incoming data pattern 502 that have been seen in the current clock cycle, allowing the matcher logic to detect matches in later clock cycles which point back to the current data being observed. Therefore, the hash update logic stores hash (DEFG) 704*a* in hash table 506*a*, hash (EFGX) 704*b* in hash table 506*b*, hash (FGXX) 704*c* in hash table 506*c*, and hash (GXXX) 704*d* in hash table 506*d*. Note that all writes performed by the hash update logic may occur in parallel.

With regard to FIG. 7C and the process described in FIG. 4, in the third clock cycle (cycle 2), the extender logic receives the current 4-byte sequence analysis from the matcher logic and stores the current 4-byte sequence as M[8:11]=D,E,F,G (element 714) as a copy of the incoming data stream in the memory M. The extender logic then determines whether the active match variable (active_match) is set to one (1). In this third clock cycle, the active match variable (active_match) is set to one (1). Since the active match variable (active_match) is a one (1), the extender logic compares the current 4-byte sequence data_in [8:11]={D,E,F,G} with the data in copy of the incoming data stream in memory M at, the active position (active_pos) with a length offset M[3:6]={D,E,F,B} (element 716). The extender logic sets the constraint variable (k) to a number of bytes for which the match can be extended (between 0 and 4), in this case 3, because D,E,F match (element 716). The extender logic then sets or resets the constraint variable (k) to a minimum of the current value of the constraint variable (k) or a value of the difference between a maximum match length (max_match_len) and the active length (active_len), i.e. max_match_len−active_len. Since the constraint variable (k) is a three (3) and the active length (active_len) is equal to two (2), then the constraint variable (k) is unchanged since three (3) is less than the difference of the maximum match length (258) and the active length (3). The extender logic then determines whether the set value for the constraint variable (k) is less than 4 (k<4). Since the constraint variable (k) is less than 4, the extender logic outputs a length (L), distance (D) pair indicating a match to a previous pattern in the incoming data stream. The match indicates a length (L) of the matching pattern that is set to the active length (active_len) plus the constraint variable (k), i.e. active_len+k=2+3=5, at a distance (D) that is set to the active distance (active_dist)=5 (element 718). The extender logic then sets the increment variable (j) equal to the constraint variable (k), i.e. j=3.

The extender logic again determines Whether the increment variable (j) is equal to 4. Since j=3, the extender logic determines whether match[3] in the analysis received from the matcher logic in the third clock cycle is equal to one (1) (element 720). Since match[3] is not equal to 1, the extender logic outputs data_in[11] as a literal G (element 722). The extender logic sets the increment variable (j) equal to j+1, i.e. 3+1=4, and the extender logic again determines whether the increment variable (j) is equal to 4. Now that the increment variable (j) is equal to 4, the extender logic sets/resets the active match variable (active_match) equal to zero (0) and sets the position variable (pos) to pos+4, i.e. 8+4=12. Thus, at this point, the extender logic would have output the following compressed data sequence in an output data stream: A,B,C,D,E,F,(5,5),G.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Thus, the illustrative embodiments provide mechanisms for improving extender logic so as to implement a high-throughput compression of data mechanism and reduce the size of the extender logic on a FPGA. In this implementation, the extender logic keeps a copy of all previously seen data in memory M. Having this copy of the data in the associated memory allows the extender logic to be implemented using a simple 2-state finite state machine (FSM). The minimum length of a match in the LZW encoding is 4 bytes, which also happens to be the number of bytes that the LSZ compression mechanism processes per clock cycle. Because of this alignment, the extender logic of the illustrative embodiments may be further simplified since the extender logic is never required to output more than a single (length, distance) pointer in a single clock cycle. This implementation results in a large area saving within the FGPA, e.g. 84% less look-up tables (LUTs), 70% less flip-flops, or the like, compared to previous adaptations for the LZW compression mechanism.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art without departing from the scope and spirit of the described embodiments. The embodiment was chosen and described in order to best explain the principles of the invention, the practical application, and to enable others of ordinary skill in the art to understand the invention for various embodiments with various modifications as are suited to the particular use contemplated. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, in a data processing system, for high-throughput compression of data, the method comprising:
responsive to receiving an indication of a match of a current 4-byte sequence from an incoming data stream to stored hash values in a set of hash tables:
setting an active match variable (active_match) equal to one (1);
setting an active position variable (active_pos) equal to a match position (match_pos) of an increment variable (j) (match_pos[j]);
setting an active length variable (active_len) equal to 4 minus the increment variable (j); and setting an active distance variable (active_dist) equal to a position variable (pos) plus the increment variable (j) minus the active position variable (active_pos);

responsive to receiving a subsequent 4-byte sequence from the incoming data stream and determining that the active match variable (active_match) is set to one (1), comparing the subsequent 4-byte sequence to data in a copy of the incoming data stream in memory at the active position (active_pos) with a predefined length offset;

setting a constraint variable (k) to a number of bytes for which the match is to be extended; and responsive to the constraint variable (k) being below a predetermined number, outputting a length (L), distance (D) pair indicating a match to a previous pattern in the incoming data stream, wherein the length (L) of the matching pattern that is set to the active length (active_len) plus the constraint variable (k) and the distance (D) is set to the active distance (active_dist).

2. The method of claim 1, further comprising:
incrementing the position variable (pos) by 4 before proceeding to the next 4-byte sequence.

3. The method of claim 1, further comprising:
responsive to the constraint variable (k) being equal to the predetermined number, setting the active length variable (active_len) to the active_len+4;
incrementing the position variable (pos) by 4 before proceeding to the next 4-byte sequence;
comparing the next 4-byte sequence to data in the copy of the incoming data stream in memory at the active position (active_pos) with a predefined length offset; and
setting the constraint variable (k) to a number of bytes for which the match is to be extended.

4. The method of claim 1, further comprising:
responsive to a failure to receive the indication of the match of the current 4-byte sequence from the incoming data stream to the stored hash values in the set of hash tables, outputting the incoming data at the increment variable (j) (data_in[j]) as a literal.

5. The method of claim 1, wherein the matching of the current 4-byte sequence from the incoming data stream to the stored hash values in the set of hash tables comprises:
computing a key value (Key[j]) for each of the current 4-byte data patterns at byte offsets j=0, 1, 2, and 3 using a hash function;
in order to determine whether the current 4-byte data patterns at byte offsets j=0, 1, 2, and 3 have been observed earlier in the incoming data stream, in parallel:
searching a first hash table in the set of hash tables for a first current 4-byte pattern at a byte offset j=0;
searching a second hash table in the set of hash tables for a second current 4-byte pattern at a byte offset j=1;
searching a third hash table in the set of hash tables for a third 4-byte pattern at a byte offset j=2; and
searching a fourth hash table in the set of hash tables for a fourth current 4-byte pattern at a byte offset j=3; and
responsive to detecting the match for byte offset j, setting a corresponding match flag match[j] to be equal to 1 and setting a corresponding entry in match position vector (match_pos[j]) equal to a hash table position (ht_pos) where the match was identified.

6. The method of claim 5, wherein, responsive to identifying more than one match for the byte offset j, selecting the match with the largest hash table position (ht_pos).

7. The method of claim 1, wherein the set of hash tables is updated by the method comprising:
computing a hash (Key[j]) for the current 4-byte data pattern at each byte offset j=0, 1, 2, and 3; and
in parallel:
storing the hash value at a byte offset j=0 in a first hash table;
storing the hash value at a byte offset j=1 in a second hash table;
storing the hash value at a byte offset j=2 in a third hash table; and
storing the hash value at a byte offset j=3 in a fourth hash table.

8. A computer program product comprising a computer readable storage medium having a computer readable program stored therein, wherein the computer readable program, when executed on a computing device, causes the computing device to:
responsive to receiving an indication of a match of a current 4-byte sequence from an incoming data stream to stored hash values in a set of hash tables:
set an active match variable (active_match) equal to one (1);
set an active position variable (active_pos) equal to a match position (match_pos) of an increment variable (j) (match_pos[j]);
set an active length variable (active_len) equal to 4 minus the increment variable (j); and
set an active distance variable (active_dist) equal to a position variable (pos) plus the increment variable (j) minus the active position variable (active_pos);
responsive to receiving a subsequent 4-byte sequence from the incoming data stream and determining that the active match variable (active_match) is set to one (1), compare the subsequent 4-byte sequence to data in a copy of the incoming data stream in memory at the active position (active_pos) with a predefined length offset;
set a constraint variable (k) to a number of bytes for which the match is to be extended; and
responsive to the constraint variable (k) being below a predetermined number, output a length (L), distance (D) pair indicating a match to a previous pattern in the incoming data stream, wherein the length (L) of the matching pattern that is set to the active length (active_len) plus the constraint variable (k) and the distance (D) is set to the active distance (active_dist).

9. The computer program product of claim 8, wherein the computer readable program further causes the computing device to:
increment the position variable (pos) by 4 before proceeding to the next 4-byte sequence.

10. The computer program product of claim 8, wherein the computer readable program further causes the computing device to:
responsive to the constraint variable (k) being equal to the predetermined number, set the active length variable (active_len) to the active_len+4;
increment the position variable (pos) by 4 before proceeding to the next 4-byte sequence;
compare the next 4-byte sequence to data in the copy of the incoming data stream in memory at the active position (active_pos) with a predefined length offset; and set the constraint variable (k) to a number of bytes for which the match is to be extended.

11. The computer program product of claim 8, wherein the computer readable program further causes the computing device to:
   responsive to a failure to receive the indication of the match of the current 4-byte sequence from the incoming data stream to the stored hash values in the set of hash tables, output the incoming data at the increment variable (j) (data_in[j]) as a literal.

12. The computer program product of claim 8, wherein the matching of the current 4-byte sequence from the incoming data stream to the stored hash values in the set of hash tables comprises the computer readable program further causing the computing device to:
   compute a key value (Key[j]) for each of the current 4-byte data patterns at byte offsets j=0, 1, 2, and 3 using a hash function;
   in order to determine whether the current 4-byte data patterns at byte offsets j=0, 1, 2, and 3 have been observed earlier in the incoming data stream, in parallel:
      search a first hash table in the set of hash tables for a first current 4-byte pattern at a byte offset j=0;
      search a second hash table in the set of hash tables for a second current 4-byte pattern at a byte offset j=1;
      search a third hash table in the set of hash tables for a third current 4-byte pattern at a byte offset j=2; and
      search a fourth hash table in the set of hash tables hr a fourth current 4-byte pattern at a byte offset j=3; and
   responsive to detecting the match for byte offset j, set a corresponding match flag match[j] to be equal to 1 and setting a corresponding entry in match position vector (match_pos[j]) equal to a hash table position (ht_pos) where the match was identified.

13. The computer program product of claim 12, wherein, responsive to identifying more than one match for the byte offset j, the computer readable program further causes the computing device to:
   select the match with the largest hash table position (ht_pos).

14. The computer program product of claim 8, wherein the set of hash tables is updated by the computer program product further causing the computing device to:
   compute a hash (Key[j]) for the current 4-byte data pattern at each byte offset j=0, 1, 2, and 3; and
   in parallel:
      store the hash value at a byte offset j=0 in a first hash table;
      store the hash value at a byte offset j=1 in a second hash table;
      store the hash value at a byte offset j=2 in a third hash table; and
      store the hash value at a byte offset j=3 in a fourth hash table.

15. An apparatus comprising:
   a processor; and
   a memory coupled to the processor, wherein the memory comprises instructions which, when executed by the processor, cause the processor to:
      responsive to receiving an indication of a match of a current 4-byte sequence from an incoming data stream to stored hash values in a set of hash tables:
         set an active match variable (active_match) equal to one (1);
         set an active position variable (active_pos) equal to a match position (match_pos) of an increment variable (j) (match_pos[j]);
         set an active length variable (active_len) equal to 4 minus the increment variable (j); and
         set an active distance variable (active_dist) equal to a position variable (pos) plus the increment variable (j) minus the active position variable (active_pos);
      responsive to receiving a subsequent 4-byte sequence from the incoming data stream and determining that the active match variable (active_match) is set to one (1), compare the subsequent 4-byte sequence to data in a copy of the incoming data stream in memory at the active position (active_pos) with a predefined length offset;
      set a constraint variable (k) to a number of bytes for which the match is to be extended; and
      responsive to the constraint variable (k) being below a predetermined number, output a length (L), distance (D) pair indicating a match to a previous pattern in the incoming data stream, wherein the length (L) of the matching pattern that is set to the active length (active_len) plus the constraint variable (k) and the distance (D) is set to the active distance (active_dist).

16. The apparatus of claim 15, wherein the instructions further cause the processor to:
   increment the position variable (pos) by 4 before proceeding to the next 4-byte sequence.

17. The apparatus of claim 15, wherein the instructions further cause the processor to:
   responsive to the constraint variable (k) being equal to the predetermined number, set the active length variable (active_len) to the active_len+4;
   increment the position variable (pos) by 4 before proceeding to the next 4-byte sequence;
   compare the next 4-byte sequence to data_in the copy of the incoming data stream in memory at the active position (active_pos) with a predefined length offset; and
   set the constraint variable (k) to a number of bytes for which the match is to be extended.

18. The apparatus of claim 15, wherein the instructions further cause the processor to:
   responsive to a failure to receive the indication of the match of the current 4-byte sequence from the incoming data stream to the stored hash values in the set of hash tables, output the incoming data at the increment variable (j) (data_in[j]) as a literal.

19. The apparatus of claim 15, wherein the matching of the current 4-byte sequence from the incoming data stream to the stored hash values in the set of hash tables comprises the instructions further causing the processor to:
   compute a key value (Key[j]) for each of the current 4-byte data patterns at byte offsets j=0, 1, 2, and 3 using a hash function;
   in order to determine whether the current 4-byte data patterns at byte offsets j=0, 1, 2, and 3 have been observed earlier in the incoming data stream, in parallel:
      search a first hash table in the set of hash tables for a first current 4-byte pattern at a byte offset j=0;
      search a second hash table in the set of hash tables for a second current 4-byte pattern at a byte offset j=1;
      search a third hash table in the set of hash tables for a third current 4-byte pattern at a byte offset j=2; and search a fourth hash table in the set of hash tables for a fourth current 4-byte pattern at a byte offset j=3; and responsive to detecting the match for byte offset j, set a corresponding match flag match[j] to be equal to 1 and setting a corresponding entry in match position vector (match_pos[j]) equal to a hash table position (ht_pos) where the match was identified.

20. The apparatus of claim 19, wherein, responsive to identifying more than one match for the byte offset j, the instructions further cause the processor to:

select the match with the largest hash table position (ht_pos).

* * * * *